US008351613B2

(12) United States Patent
Merks

(10) Patent No.: US 8,351,613 B2
(45) Date of Patent: Jan. 8, 2013

(54) METHOD AND APPARATUS FOR MEASUREMENT OF GAIN MARGIN OF A HEARING ASSISTANCE DEVICE

(75) Inventor: Ivo Leon Diane Marie Merks, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 189 days.

(21) Appl. No.: 12/651,194

(22) Filed: Dec. 31, 2009

(65) Prior Publication Data

US 2010/0172507 A1 Jul. 8, 2010

Related U.S. Application Data

(63) Continuation of application No. 11/276,543, filed on Mar. 4, 2006, now Pat. No. 7,664,281.

(51) Int. Cl.
*H04R 29/00* (2006.01)
*H03G 3/00* (2006.01)
*H04R 25/00* (2006.01)

(52) U.S. Cl. ........................... 381/60; 381/108; 381/312

(58) Field of Classification Search .................. 381/312, 381/317, 318, 320, 321, 60, 56, 58, 104, 381/107, 98, 93
See application file for complete search history.

(56) References Cited

U.S. PATENT DOCUMENTS 5,016,280 A 5/1991 Engebretson et al.
5,091,952 A 2/1992 Williamson et al.
5,357,251 A 10/1994 Morley, Jr. et al.
5,475,759 A 12/1995 Engebretson
6,072,884 A 6/2000 Kates
6,118,877 A 9/2000 Lindemann et al.
6,134,329 A * 10/2000 Gao et al. ........................ 381/60
6,219,427 B1 * 4/2001 Kates et al. ................... 381/318
7,058,182 B2 * 6/2006 Kates .............................. 381/60
(Continued)

FOREIGN PATENT DOCUMENTS

EP 1624719 A2 2/2010
(Continued)

OTHER PUBLICATIONS

"European Application Serial No. 07250893.0, Extended Search Report mailed Oct. 25, 2010", 6 pgs.

(Continued)

*Primary Examiner* — Curtis Kuntz
*Assistant Examiner* — Sunita Joshi
(74) *Attorney, Agent, or Firm* — Schwegman, Lundberg & Woessner, P.A.

(57) ABSTRACT

Method and apparatus for determination of gain margin of a hearing assistance device under test. In varying examples, the impulse response for multiple levels can be taken and used to arrive at a gain margin. The method and apparatus, in various examples, process critical portions of the resulting data for efficient processing and to increase accuracy of measurements. The method and apparatus performing a plurality of measurements to determine impulse responses and to derive gain margin as a function of frequency therefrom. The present subject matter includes principles which may are adapted for use within a hearing assistance device using a single white noise stimulus, according to one example. The principles set forth herein can be applied to occluding and non-occluding hearing device embodiments. Additional method and apparatus can be found in the specification and as provided by the attached claims and their equivalents.

21 Claims, 5 Drawing Sheets

U.S. PATENT DOCUMENTS

| | | | |
|---|---|---|---|
| 7,664,281 | B2 | 2/2010 | Merks |
| 2002/0176584 | A1 | 11/2002 | Kates |
| 2007/0217638 | A1 | 9/2007 | Merks |

FOREIGN PATENT DOCUMENTS

| | | | |
|---|---|---|---|
| WO | WO-9912388 | A1 | 3/1999 |

OTHER PUBLICATIONS

"U.S. Appl. No. 11/276,543, Non-Final Office Action mailed May 6, 2009", 16 pgs.

"U.S. Appl. No. 11/276,543, Non-Final Office Action Response filed Oct. 6, 2009 to Non-Final Office Action mailed May 6, 2009", 14 pgs.

"U.S. Appl. No. 11/276,543, Notice of Allowance mailed Dec. 16, 2009", 7 pgs.

Egelmeers, G. P. M., "Real Time Realization Concepts of Large Adaptive Filters", *Ph.D. Thesis, Technische Universiteit Eindhoven*, (2005), 215 pgs.

Freed, D. J., et al., "Comparative Performance of Adaptive Anti-Feedback Algorithms in Commerical Hearing Aids and Integrated Circuits", *International Hearing Aid Research Conference*, (Lake Tahoe, CA), (2004), 1-8.

Maxwell, J. A., et al., "Reducing Acoustic Feedback in Hearing Aids", *IEEE Transactions on Speech and Audio Processing*, 3(4), (Jul. 1995), 304-313.

Rife, D., et al., "Transfer-Function Measurement With Maximum-Length Sequences", *J. Audio Eng. Soc.*, 37(6), (1989), 419-444.

"Compass User's Manual", Widex, 142 pgs.

"Compass User's Manual", Widex, (1997), 188 pgs.

"European Application Serial No. 07250893.0, Office Action mailed Oct. 25, 2011", 6 pgs.

"European Application Serial No. 07250893.0, Response filed Feb. 24, 2012 to Office Action mailed Oct. 25, 2011", 5 pgs.

"European Application Serial No. 07250893.0, Response filed May 12, 2011 to Extended Search Report mailed Oct. 25, 2010", 13 pgs.

"Understanding Feedback and Digital Feedback Cancellation Strategies", The Hearing Review vol. 9, No. 2, (Feb. 2002), 6 pgs.

Kates, James Mitchell, "Feedback Cancellation Apparatus and Methods", U.S. Appl. No. 09/081,474, filed May 19, 1998, 157 pgs.

Keidser, Gitte, et al., "Comparing proprietary and prescription methods for fitting non-linear hearing aids", Australian Hearing National Acoustics Laboratories: Research & Development Annual Report 2000/2001, 36-39.

* cited by examiner

METHOD AND APPARATUS FOR MEASUREMENT OF GAIN MARGIN OF A HEARING ASSISTANCE DEVICE

RELATED APPLICATION

The present application is a continuation of U.S. patent application Ser. No. 11/276,543, filed on Mar. 4, 2006, which is incorporated herein by reference in its entirety.

TECHNICAL FIELD

This disclosure relates generally to hearing assistance devices, and more particularly to measurement of gain margin in hearing assistance devices.

BACKGROUND

Hearing assistance devices, such as hearing aids, amplify received sound to assist the hearing of the wearer. Modern devices tailor the amplification to attempt to restore natural hearing to the wearer of the device. In the case of hearing aids, a microphone receives sound, processes it to meet the needs of the wearer, and produces audible sound to the wearer's ear using a receiver, also known as a speaker. Some hearing aids are designed to occlude the ear canal, and thereby reduce the amount of sound transmitted back from the receiver to the microphone. In such devices, attenuation of sound reaching the microphone from the receiver is used to prevent feedback from becoming oscillation. This allows the hearing aid to use more amplification without ringing or squealing oscillations.

Some devices use a non-occluding approach, whereby amplified sound is provided to the ear canal, but in a way where an open passageway for sound is provided to the ear. Such designs must be careful with use of gain, since there is a higher probability that sound from the receiver will feed back into the microphone of the hearing aid as oscillations.

In both occluding and non-occluding devices, determination of the amount of amplification that can be used, or gain margin, before oscillating is difficult. One way this is done is to reduce gain of the device until oscillations disappear. Such an approach is crude and inefficient since gain margins vary over the sound hearing frequency ranges. Thus, if not done properly, the frequencies most likely to result in oscillation limit the available gain for the remainder of the hearing frequencies.

What is needed in the art is an improved system for determining the amount of available gain margin as a function of frequency. The system should be straightforward to implement in uses with hearing assistance devices.

SUMMARY

The above-mentioned problems and others not expressly discussed herein are addressed by the present subject matter and will be understood by reading and studying this specification.

The present subject matter provides method and apparatus for determination of gain margin of a hearing assistance device under test. In varying embodiments, the impulse response for multiple levels can be taken and used to arrive at a gain margin. The method and apparatus, in various embodiments, process critical portions of the resulting data for efficient processing and to increase accuracy of measurements. The method and apparatus performing a plurality of measurements to determine impulse responses and to derive gain margin as a function of frequency therefrom.

The present subject matter includes principles which may are adapted for use within a hearing assistance device using a single white noise stimulus, according to one embodiment. Such teachings can be applied to occluding and non-occluding hearing device embodiments.

This Summary is an overview of some of the teachings of the present application and not intended to be an exclusive or exhaustive treatment of the present subject matter. Further details about the present subject matter are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

DETAILED DESCRIPTION

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

The present subject matter relates to methods and apparatus for measurement of gain margin of a hearing assistance device. In various embodiments, the measurement can be done in a testing environment. In such embodiments, the method and apparatus can estimate the gain margin product from three impulse response measurements with a hearing assistance device set at different amplification levels. In various embodiments the measurement can be done in a hearing assistance device, such as a hearing aid. In such embodiments, the method and apparatus can measure the gain margin product within a hearing aid with a single measurement. The method and apparatus set forth herein are demonstrative of the principles of the invention, and it is understood that other method and apparatus are possible using the principles described herein.

Measurement of Gain Margin from Outside of the Device

Figure 1:
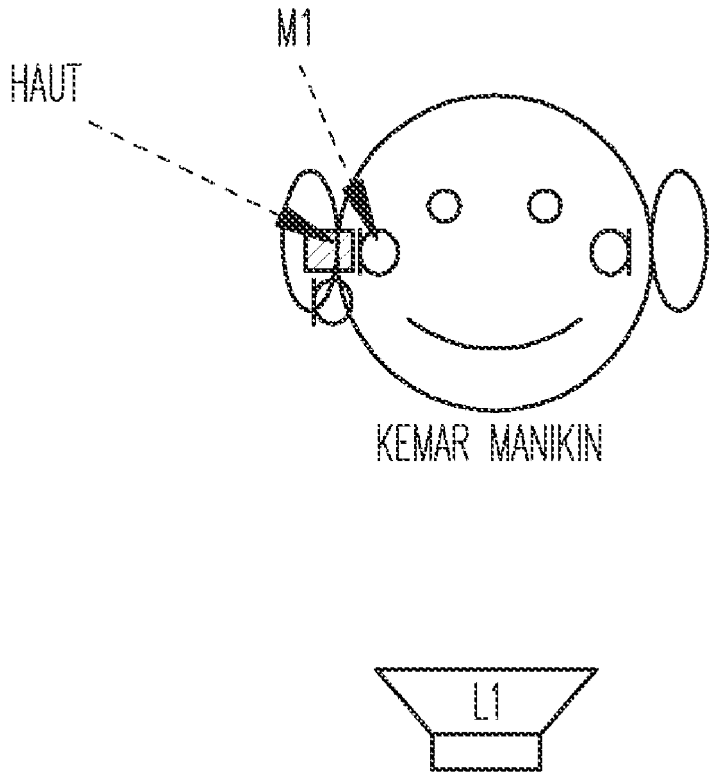
FIG. 1 shows a measurement set up using a subject or KEMAR manikin, according to various embodiments of the present subject matter.

One approach for measuring sound, according to various embodiments, includes:

1) placing a subject or KEMAR manikin within a measurement set up as shown in FIG. 1.

2) placing a hearing assistance device to be tested in the subject/KEMAR manikin with a probe microphone M1 placed in the ear canal 3) setting parameters of the hearing assistance device to make the hearing assistance device linear across normal sound ranges 4) applying a stimulus (for example, white noise signal with 8 KHz bandwidth and duration from about 4 seconds to about 20 seconds) using loudspeaker L1 at three hearing assistance device levels (for example, at: −75 dB or "mute level", −20 dB or "low level", and −10 dB or "high level")

5) recording samples of sound from M1 for each stimulus 6) storing each recording as an array of measured impulse response samples, creating a mute level array, a low level array, and a high level array 7) processing the stored arrays, as follows:

a. Subtract the mute level array from the low level array to create a processed low level array b. Subtract the mute level array from the high level array to create a processed high level array c. Determine a scaling factor between the processed low level array and the processed high level array d. Scale the processed low level array with the scaling factor to create a scaled processed low level array e. Determine the difference between the processed high level array and the scaled processed low level array to create a feedback-only processed high level array f. Segment the processed high level array into leakage, hearing amplification, and first feedback part g. Take the hearing amplification segment from the processed high level array, zero-pad it with zeros to create a N-sample high level amplification array, where N is typically a power of 2 h. Take the first feedback part segment of the feedback-only processed high level array, zero-pad it with zeros to create a N-sample high-level feedback array i. Convert the high-level amplification array and the high-level feedback array to the frequency domain j. Deconvolve the frequency domain high-level feedback array with the high level amplification array to produce a gain margin profile as a function of frequency The resulting gain margin profile will have (N/2)+1 samples, where N is the number of samples in the frequency transform, such as a fast Fourier transform (FFT).

In one embodiment, the measurement sequence includes a stimulus, such as white noise signal with bandwidth 8 kHz, played on the first output channel (connected to loudspeaker L1) of an Echo Gina 24 soundcard made by Echo Digital Audio Corporation of Carpinteria, Calif., while both inputs are recorded. Other soundcards/data acquisition cards may be used without departing from the scope of the present subject matter. A stimulus is played through loudspeaker L1. Microphone M1 is recorded. The hearing assistance device can be linked to a programmer to set the parameters. The hearing assistance device is programmed to operate in the linear range. Such a measurement is done at three levels of the hearing assistance device. The actual levels may vary, but some that have been used successfully include: mute level (sliders at, for example, −75 dB); low level (sliders at, for example, −20 dB); and high level (sliders at, for example, −10 dB). The actual settings may vary without departing from the scope of the present subject matter.

The recorded microphone signal M1 and the original stimulus are used to calculate the impulse responses of the three measurements. The transfer functions of these impulse responses are called $H_{zero}(f)$, $H_{low}(f)$, and $H_{high}(f)$. The impulse response is calculated from the stimulus and recorded samples using a number of approaches including, but not limited to, a Wiener filter or an adaptive filter (NLMS/FDAF). Some methods and apparatus to do this are found in *Adaptive Filter Theory* ($4^{th}$ Edition)(Hardcover) by Simon Haykin, Prentice Hall, 2001. Other methods and apparatus can be found in various other texts on the subject.

Mathematical Treatment

Figure 2A:
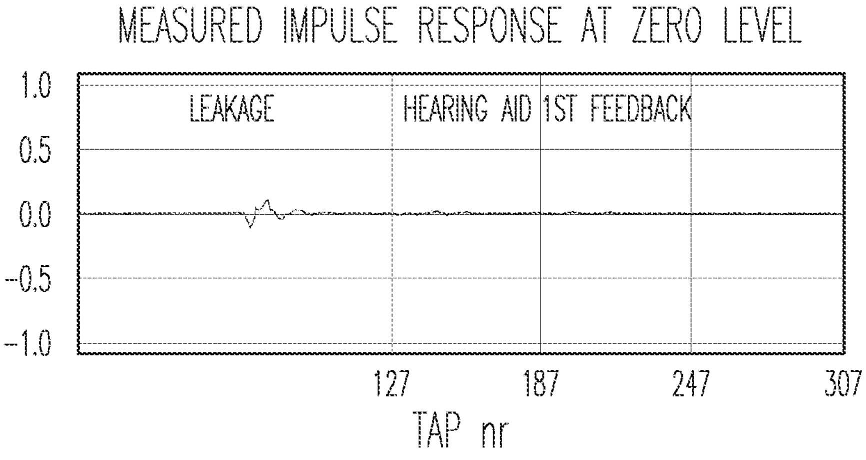
FIGS. 2A, 2B, and 2C are graphs of measured impulse responses at mute, low, and high levels respectively, according to various embodiments of the present subject matter.
Figure 2B:
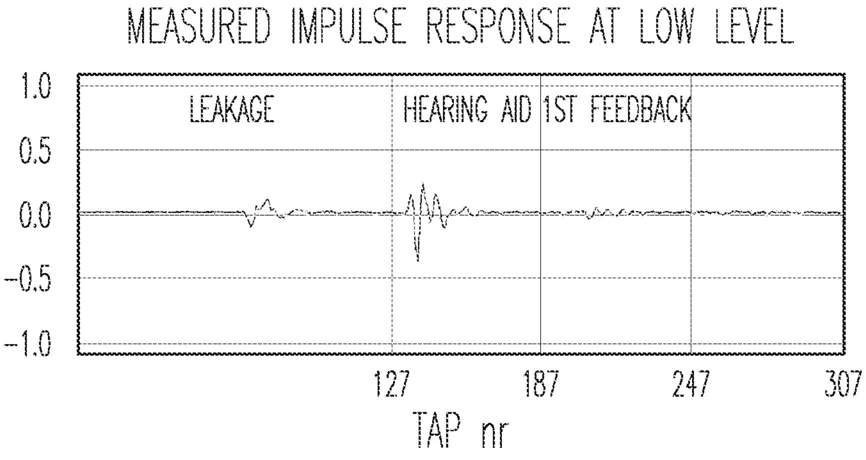
Figure 2C:
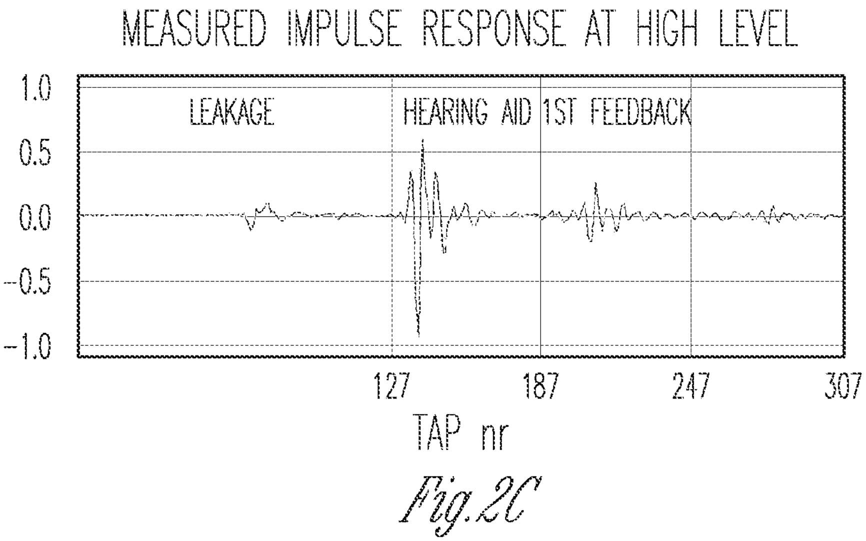

An example of the measured impulse responses is shown in FIGS. 2A, 2B, and 2C. In the example shown, a 308 tap FIR filter using a sampling frequency of about 16 kHz is employed to demonstrate the present subject matter.

FIG. 2A shows the impulse response at mute level. Hence, this is the impulse response of the leakage. The energy of the impulse response is mainly located at the beginning of the impulse response.

FIG. 2B, the middle graph, shows the impulse response at low level. Besides the leakage, the impulse response caused by the hearing assistance device is also showing. This response is located at a later time in the impulse response because of the processing delay of the hearing assistance device.

FIG. 3B, the bottom graph, shows the impulse response at a high level. Besides the impulse responses due to leakage and the hearing aid, it also shows the impulse response caused by the feedback and reprocessing of the hearing aid. This response is again located at a later time due to the two processing delays.

From these three impulse responses, the gain margin $|K_{high}(f)\beta(f)|$ can be calculated because the following relations are true (stated in frequency domain):

$$H_{zero}(f)=L(f) \quad [1]$$

$$H_{Low}(f)=L(f)+H_1(f)K_{low}(f)H_2(f)+H_1(f)K_{low}(f)\beta(f)K_{low}(f)H_2(f) \quad [2]$$

$$H_{High}(f)=L(f)+H_1(f)K_{high}(f)H_2(f)+H_1(f)K_{high}(f)\beta(f)K_{high}(f)H_2(f) \quad [3]$$

$$K_{low}(f)=\alpha K_{high}(f),\text{ where } \alpha<1 \quad [4]$$

Here L(f) is the forward leakage, $H_1(f)$ is the transfer function from loudspeaker to microphone of the hearing aid, $H_2(f)$ is the transfer function from receiver of hearing aid to microphone M1, and $\alpha$ is the proportionality factor between the low and high level. The proportionality factor $\alpha$ can be read from the settings of the hearing aid or it can be calculated from the second part of the impulse responses of $H_{low}(f)$ and $H_{high}(f)$.

Substituting Equation $K_{low}(f)=\alpha K_{high}(f)$, where $\alpha<1$ [4] in Equation $H_{Low}(f)=L(f)+H_1(f)K_{low}(f)H_2(f)+H_1(f)K_{low}(f)\beta(f)K_{low}(f)H_2(f)$ [2] and subtracting Equation $H_{zero}(f)=L(f)$ [1] from Equation $H_{Low}(f)=L(f)+H_1(f)K_{low}(f)H_2(f)+H_1(f)K_{low}(f)\beta(f)K_{low}(f)H_2(f)$ [2] and Equation $H_{High}(f)=L(f)+H_1(f)K_{high}(f)H_2(f)+H_1(f)K_{high}(f)\beta(f)K_{high}(f)H_2(f)$ [3] results in:

$$H_{Low}(f)-H_{zero}(f)=\alpha H_1(f)K_{high}(f)H_2(f)+\alpha^2 H_1(f)K_{high}(f)\beta(f)K_{high}(f)H_2(f) \quad [5]$$

$$H_{High}(f)-H_{zero}(f)=H_1(f)K_{high}(f)H_2(f)+H_1(f)K_{high}(f)\beta(f)K_{high}(f)H_2(f) \quad [6]$$

Hence it is possible to estimate $H_1(f)K_{high}(f)\beta(f)K_{high}(f)H_2(f)$ and $H_1(f)K_{high}(f)H_2(f)$. Deconvolving $H_1(f)K_{high}(f)\beta(f)K_{high}(f)H_2(f)$ with $H_1(f)K_{high}(f)H_2(f)$ results in:

$$|K_{high}(f)\beta(f)| = \left| \frac{H_1(f)K_{high}(f)\beta(f)K_{high}(f)H_2(f) \dfrac{(H_1(f)K_{high}(f)H_2(f))^*}{(H_1(f)K_{high}(f)H_2(f))^*}}{(H_1(f)K_{high}(f)H_2(f))+\varepsilon} \right|. \quad [7]$$

Figure 3:
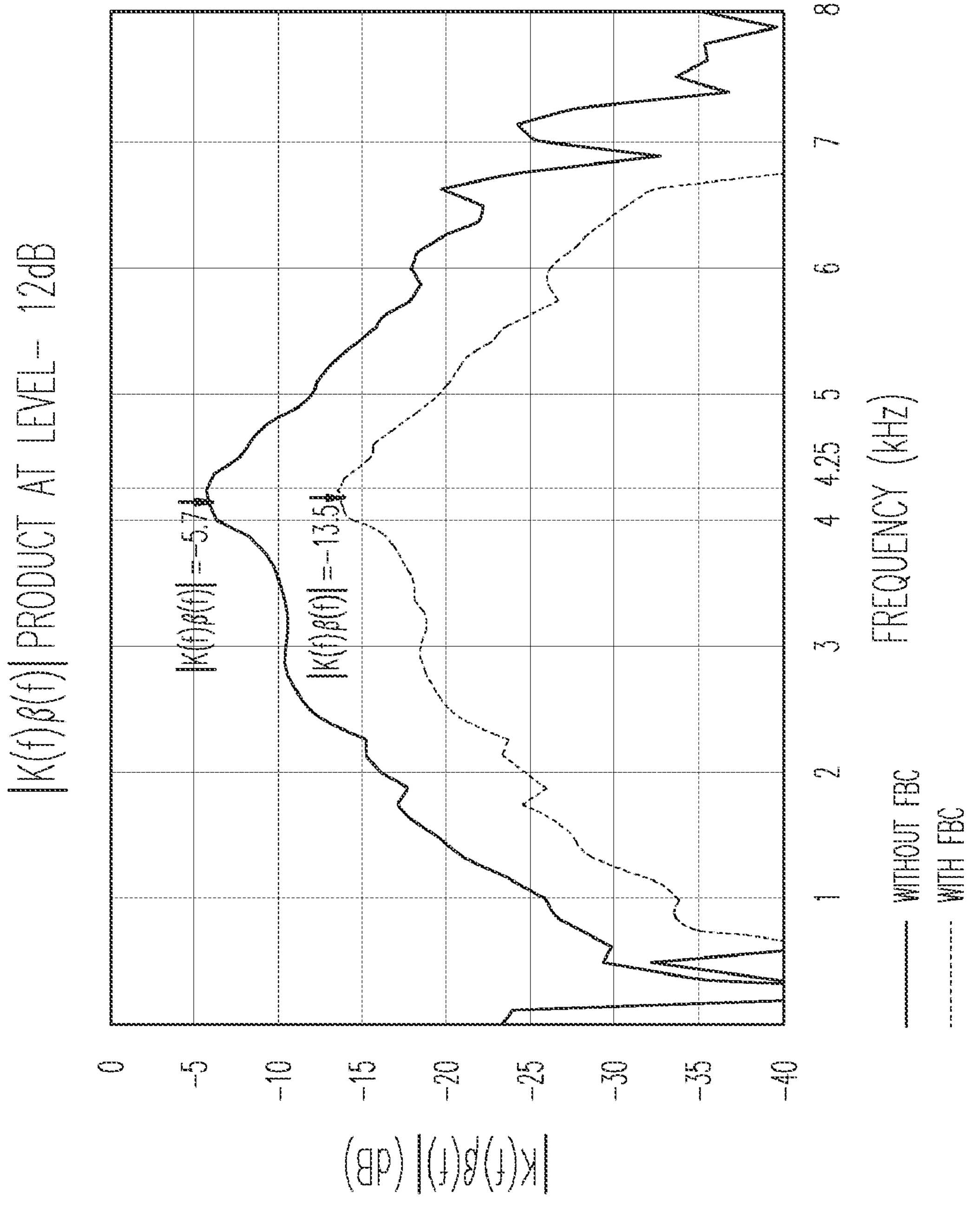
FIG. 3 is a frequency chart showing gain margin for feedback cancellation on and feedback cancellation off, according to various embodiments of the present subject matter.

Here, * is the conjugate operator and $\epsilon$ is normalization constant. FIG. 3 shows the product $|K_{high}(f)\beta(f)|$ for the hearing assistance device with and without feedback cancellation (FBC).

The product $|K_{high}(f)\beta(f)|$ is relative to the high level (for example for a device set such that a high level=−12 dB). The product is −5.7 dB for the hearing assistance device without feedback cancellation, which means that the hearing assistance device becomes unstable at level −12 dB+5.7=−6.3 dB at frequency f=4.25 kHz. This has been confirmed with a measurement at that particular level.

The gain margin is −13.5 dB for the hearing assistance device with feedback cancellation. This means that the hearing assistance device would become unstable at level −12+13.5 dB=1.5 dB at frequency=4.25 kHz. Thus, the present approach gives more information than a simple device test, since for the device its maximum level is 0 dB.

According to this embodiment, the measurement method can estimate the level and the frequency at which the hearing assistance device becomes unstable from measurements at three levels of amplification in the hearing assistance device. Hence it is not necessary to search for this level manually. Furthermore these measurements give more insight in the feedback system than the PCR metric. The present measurements can provide, among other things, an objective measure of gain margin as a function of frequency without an exhaustive search for the correct amplication factor, and a measure fo gain margin of hearing assistance devices with limited (by hardware or software design) gain.

In one embodiment, levels are selected automatically and the gain margin measurements are automated. In various applications, automation is facilitated by levels that are hearing assistance device independent. If the hearing assistance device contains a feedback canceller which can be disabled, it is possible to measure the added stable gain and the amount of feedback cancellation. Such measurements show, among other things, the efficacy of the feedback canceller.

Measuring Gain Margin within the Hearing Assistance Device

Figure 4:
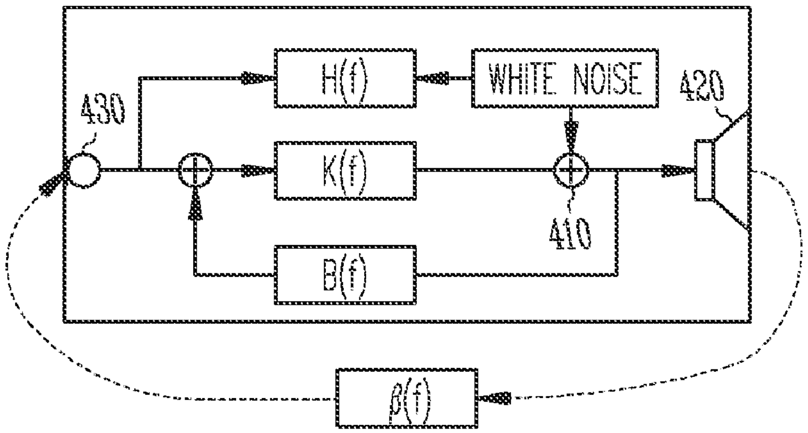
FIG. 4 is a hearing assistance device according to one embodiment of the present subject matter.

The aforementioned principles were applied to develop methods to measure the gain margin from within the hearing assistance device. In one embodiment, a hearing assistance device is configured as demonstrated in FIG. 4. The hearing assistance device of FIG. 4 is configured to measure $|K_{high}(f)\beta(f)|$ product in the hearing assistance device, where B(f) is the feedback canceller and H(f) is the impulse response to be measured. The block entitled β(f) is the acoustic feedback path, K(f) is a transfer function for a hearing assistance device, such as a hearing aid. The K(f) block may be embodied in hardware, software, or in combinations of each. The white noise is provided to summer 410 and to the impulse response module H(f). A microphone 430 and receiver 420 are shown.

The references to a stylized "f" in the variables imply that the processing done in each block is in the frequency domain. It is noted that some of the details of conversion from time domain signals (such as from microphone 430) to frequency domain signals, and vice-versa, were omitted from the figures to simplify the figures. Several known approaches exist to digitize the data and convert it into frequency domain values. For example, in various embodiments overlap-add structures (not shown) are available to assist in conversion to the frequency domain and, from frequency domain back into time domain. Some such structures are shown, for example, in *Adaptive Filter Theory* ($4^{th}$ Edition) by Simon Haykin, Prentice Hall, 2001 and *Real Time Realization of Large Adaptive Filters*, G.P.M. Egelmeers, Eindhoven Technical University of Technology, Ph.D. Thesis, November, 1995.

A white noise signal is added to the receiver signal and the microphone signal is recorded. The impulse response, H(f), is calculated from the microphone signal and white noise signal. The impulse response is calculated from the white noise stimulus and recorded microphone samples using a number of approaches including, but not limited to, a Wiener filter or an adaptive filter (NLMS/FDAF). Some methods and apparatus to do this are found in *Adaptive Filter Theory* ($4^{th}$ Edition) by Simon Haykin, Prentice Hall, 2001. Other methods and apparatus can be found in various other texts on the subject.

Gain Margin Calculation with Unknown Gain

When measured using the system of FIG. 4, the impulse response has again two clearly distinctive parts. The first part is equal to the feedback path, β(f), and the second part is the reprocessed part which is equal to (β(f)−B(f))K(f)β(f). White noise is played directly to the receiver of the hearing assistance device, as shown in FIG. 4. Because there is no forward leakage (forward leakage here meaning sound arising from the external loudspeaker to the eardrum), β(f) and (β(f)−B(f))K(f)β(f) can be calculated using a number of approaches. One approach is to use two measurements whereby the first part, β(f), is produced by muting the processing in the hearing assistance device (e.g., K(f)=0), and then the second part (β(f)−B(f))K(f)β(f), is produced by setting K(f) to a typical gain of the hearing assistance device.

Figure 5:
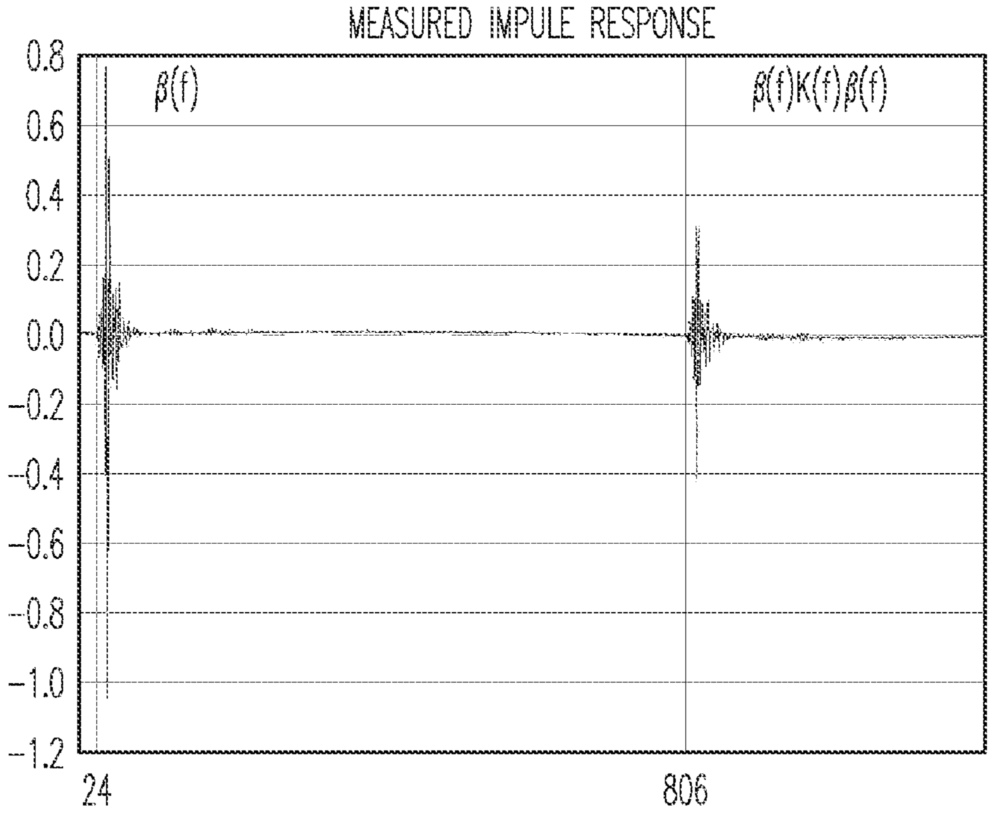
FIG. 5 is a measured impulse response of the system of FIG. 4 according to one embodiment of the present subject matter.

Another approach is to use a single measurement whereby K(f) is set to a typical gain and a white noise stimulus is injected as shown in FIG. 4. In varying embodiments, the white noise stimulus has a duration of between about 2 to about 6 seconds. In one example, a white noise stimulus of about 4 seconds is injected to estimate gain margin. Other stimulus durations may be used without departing from the scope of the present subject matter. Such durations may be shorter than the previous approach using an external loudspeaker. As the white noise is applied, the impulse response to the stimulus is recorded. An array of values is generated for the impulse response, which is demonstrated graphically by FIG. 5. The first pulse is representative of the first part, β(f), and the second pulse is representative of the second part, (β(f)−B(f)) K(f)β(f). These pulses are distinguishable since white noise is generated and injected within the hearing assistance device, as opposed to white noise received from a loudspeaker. This approach avoids reverberation effects arising from the stimulus bouncing off of walls and the reverberance effect in the ear canal. Both impulse responses are measured for the typical K(f), creating two arrays of impulse information which are indexed in time increments (or taps in a digital filter embodiment). In this example, β(f) can be obtained from taps at or about 24 to about 224 and then the second part, (β(f)−B(f)) K(f) β(f), is obtained from taps at or about 806 to about 1006. In various embodiments, zero padding is done before performing a transform. For example, in a transform where N=256 samples are used, zero padding is used to get to 256 samples (taps). An FFT of each peak of both impulse responses is performed (256 samples per peak), which is demonstrated by FIG. 6A. The resulting frequency domain profiles are deconvolved and the resulting gain margin is shown in FIG. 6B.

This test is performed with the device in the patient's ear to avoid feedback. Such a test can be done in the beginning of device use. Additional tests may be done at later times.

In this approach, there is no $H_1(f)$ and no $H_2(f)$ and if K(f) has a short impulse response, then gain margin can be determined in a single measurement. The product (β(f)−B(f)) K(f) can be calculated as:

$$(\beta(f)-B(f))K(f)=\frac{((\beta(f)-B(f))K(f)\beta(f))\beta^*(f)}{\beta(f)\beta^*(f)+\varepsilon}. \quad [8]$$

Measurement with a Non-Occluding Hearing Assistance Device

A measurement as described above can be done with a modified non-occluding hearing assistance device. In one test of the application to non-occluding hearing aids, the hearing aid processing was done on a PC with an Echo sound card. For this test, there was no feedback canceller present (B(f)=0). The microphone signal was amplified and sent to the receiver while a white noise source (e.g., Gaussian noise) was added to the receiver signal as shown FIG. 4. The measured impulse response is shown in FIG. 5. The two different parts of the impulse response, β(f) and β(f)K(f)β(f), are clearly distinguishable. The large processing delay is due to the latency of the soundcard. Other soundcards may be used which have smaller latencies and which are comparable to an actual delay in a hearing aid.

Figure 6A:
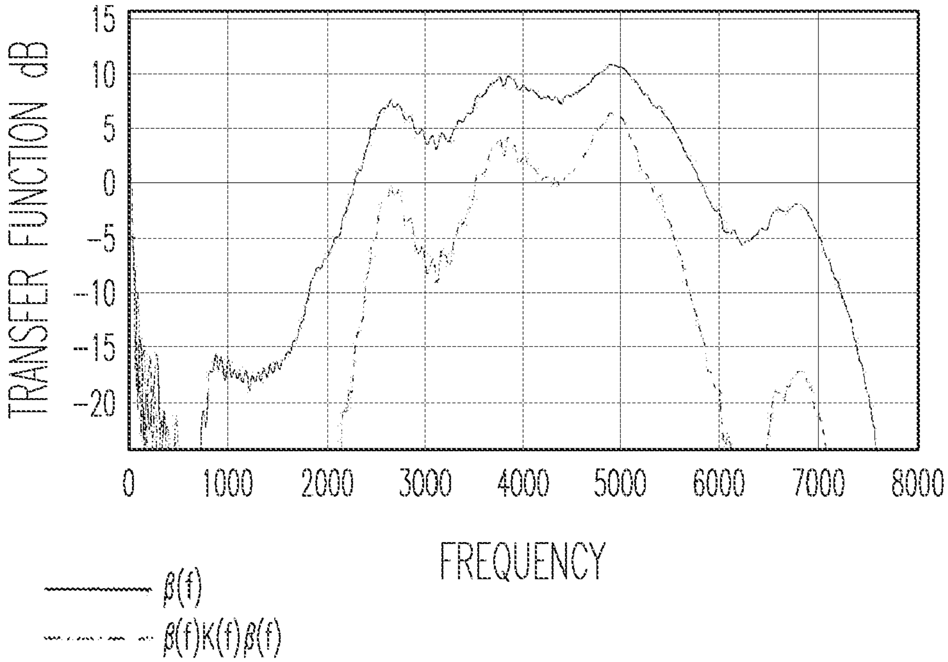
FIG. 6A is a plot of frequency domain profiles for a first pulse of the impulse response and a second pulse of the impulse response, according to one embodiment of the present subject matter.
Figure 6B:
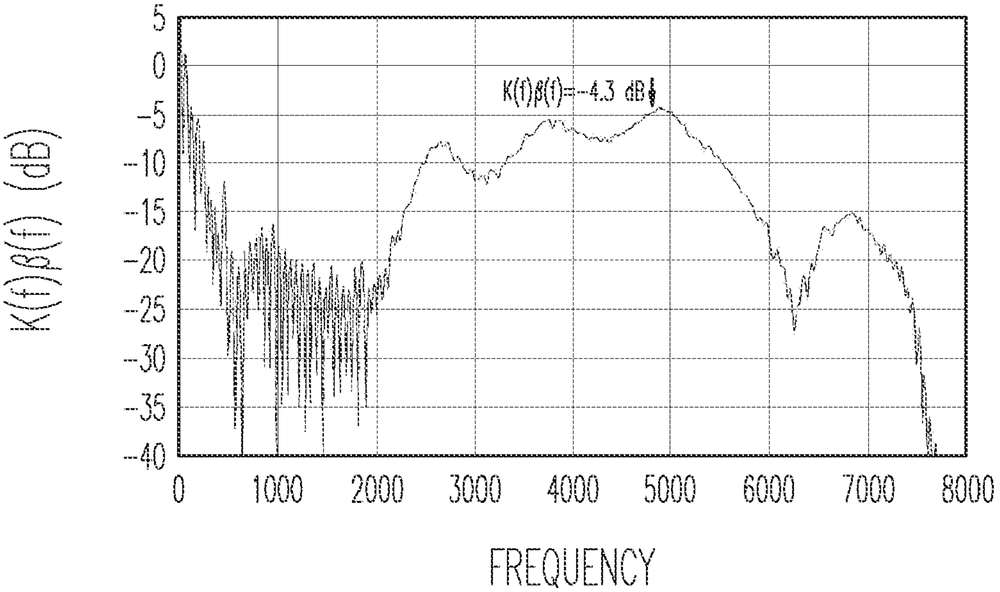
FIG. 6B is a plot of gain margin based on a deconvolution of the curves of FIG. 6A, according to one embodiment of the present subject matter.

The measured transfer functions, β(f) and β(f)K(f)β(f) are calculated from the impulse response and shown in FIG. 6A. These measurements are obtained by an FFT of the windowed pulses of the impulse responses. The feedback is mainly between 2 and 4 kHz and the measurement is not as accurately at lower frequencies due to the presence of noise. Note that the absolute level of feedback is also influenced by the settings of pre-amplifiers etc and the amplification factor is actually an attenuation factor.

FIG. 6B shows an estimated |K(f)β(f)| based on a deconvolution of the β(f) and β(f)K(f)β(f) curves of FIG. 6A. The estimated |K(f)β(f)| indicates that the feedback will occur when the amplification K(f) of the hearing aid is increased by 4.3 dB at frequency 4.9 kHz. This can be confirmed with another measurement.

These curves show how to calculate the |K(f)β(f)| within a hearing assistance device. Measurements using white noise stimulus generated from about 2 to about 6 seconds have been shown to give a reliable deconvolution. The durations of the white noise stimulus vary, and other durations may be used without departing from the scope of the present subject matter.

Thus, the present measurement method can estimate the level and the frequency at which the hearing assistance device becomes unstable from a single measurement at a high level of amplification in the hearing assistance device.

It is understood that the term "array" used herein is not intended to be limited to a particular data storage structure. Consequently, any data storage structure which can accomplish the principles set forth herein is contemplated by the present subject matter.

It is further understood that the principles set forth herein can be applied to a variety of hearing assistance devices, including, but not limited to occluding and non-occluding applications. Some types of hearing assistance devices which may benefit from the principles set forth herein include, but are not limited to, behind-the-ear devices, over-the-ear devices, on-the-ear devices, and in-the ear devices, such as in-the-canal and/or completely-in-the canal hearing assistance devices. Other applications beyond those listed herein are contemplated as well.

CONCLUSION

This application is intended to cover adaptations or variations of the present subject matter. It is to be understood that the above description is intended to be illustrative, and not restrictive. Thus, the scope of the present subject matter is determined by the appended claims and their legal equivalents.

What is claimed is:

1. A hearing apparatus for a subject having an ear with an ear canal, the hearing apparatus comprising:

a receiver configured to be placed in or about the ear;

at least one microphone configured to be placed in or about the ear and configured to produce a signal related to sounds reaching said microphone; and a digital signal processing device in communication with the receiver and the at least one microphone, the digital signal processing device including a configuration having an acoustic feedback canceller that reduces an amount of acoustic feedback produced by the hearing apparatus, wherein the digital signal processing device configured to provide at least one mode wherein a noise generator in the hearing apparatus is configured to provide at least a white noise signal to be played by the receiver with the acoustic feedback canceller activated, and at least another mode wherein the digital signal processor is configured to provide hearing aid processing using the microphone and the receiver and with the acoustic feedback canceller activated, and wherein in the at least one mode the digital signal processing device is configured to execute instructions to use the microphone to receive sounds played by the receiver using at least in part the white noise signal, the digital signal processing device programmed to generate an estimate of gain margin over a range of different frequencies by processing a recorded impulse response to the white noise signal of the hearing apparatus.

2. The hearing apparatus of claim 1, wherein the white noise generator is configured to produce a white noise stimulus having a duration of about 2 seconds to 6 seconds.

3. The hearing apparatus of claim 2, wherein the recorded response is stored in an array in memory.

4. The hearing apparatus of claim 3, wherein the array of memory includes a first part and a second part that are distinguishable.

5. The hearing apparatus of claim 4, wherein the digital signal processing device is programmed to:

perform identification of the first part and the second part of the impulse response, to place the first part and the second part into two different arrays, zero pad the arrays if needed to get to a same number of array values, perform a Fast Fourier Transform (FFT) of the different arrays, and
deconvolve the transformed arrays to produce gain margin information for different frequencies.

6. The hearing apparatus of claim 5, wherein the hearing apparatus is used in an occluding configuration to the ear canal.

7. The hearing apparatus of claim 5, wherein the hearing apparatus is used in a non-occluding configuration to the ear canal.

8. The hearing apparatus of claim 5, wherein the hearing apparatus contains the digital signal processing device in a housing adapted to be placed behind-the-ear.

9. The hearing apparatus of claim 5, wherein the hearing apparatus contains the digital signal processing device in a housing adapted to be placed in-the-ear.

10. The hearing apparatus of claim 5, wherein the hearing apparatus contains the digital signal processing device in a housing adapted to be placed in-the-canal.

11. The hearing apparatus of claim 5, wherein the hearing apparatus contains the digital signal processing device in a housing adapted to be placed completely in-the-canal.

12. The hearing apparatus of claim 1, wherein the white noise generator is configured to produce a white noise stimulus of about 4 seconds of duration.

13. The hearing apparatus of claim 12, wherein the recorded response is stored in an array in memory.

14. The hearing apparatus of claim 13, wherein the array of memory includes a first part and a second part that are distinguishable.

15. The hearing apparatus of claim 14, wherein the digital signal processing device is programmed to:
perform identification of the first part and the second part of the impulse response, to place the first part and the second part into two different arrays,
zero pad the arrays if needed to get to a same number of array values,
perform a Fast Fourier Transform (FFT) of the different arrays, and
deconvolve the transformed arrays to produce gain margin information for different frequencies.

16. The hearing apparatus of claim 15, wherein the hearing apparatus is used in an occluding configuration to the ear canal.

17. The hearing apparatus of claim 15, wherein the hearing apparatus is used in a non-occluding configuration to the ear canal.

18. The hearing apparatus of claim 15, wherein the hearing apparatus contains the digital signal processing device in a housing adapted to be placed -behind-the-ear.

19. The hearing apparatus of claim 15, wherein the hearing apparatus contains the digital signal processing device in a housing adapted to be placed in-the-ear.

20. The hearing apparatus of claim 15, wherein the hearing apparatus contains the digital signal processing device in a housing adapted to be placed in-the-canal.

21. The hearing apparatus of claim 15, wherein the hearing apparatus contains the digital signal processing device in a housing adapted to be placed completely in-the-canal.

* * * * *